United States Patent
Jacob-Mitos et al.

(10) Patent No.: US 8,774,582 B1
(45) Date of Patent: Jul. 8, 2014

(54) ETCH-SELECTIVE BONDING LAYER FOR HYBRID PHOTONIC DEVICES

(75) Inventors: Matthew Jacob-Mitos, Goleta, CA (US); Gregory Alan Fish, Santa Barbara, CA (US); Alexander W. Fang, Fremont, CA (US)

(73) Assignee: Aurrion, Inc., Goleta, CA (US)

( * ) Notice: Subject to any disclaimer, the term of this patent is extended or adjusted under 35 U.S.C. 154(b) by 242 days.

(21) Appl. No.: 13/461,634

(22) Filed: May 1, 2012

(51) Int. Cl.
- G02B 6/10 (2006.01)
- G02B 6/00 (2006.01)
- H01L 21/76 (2006.01)
- H01L 21/46 (2006.01)
- H01L 21/30 (2006.01)

(52) U.S. Cl.
USPC ............... 385/131; 385/14; 385/40; 438/406; 438/455

(58) Field of Classification Search
None
See application file for complete search history.

(56) References Cited

U.S. PATENT DOCUMENTS

| | | | | |
|---|---|---|---|---|
| 8,150,228 B2* | 4/2012 | Jones et al. | ............... | 385/129 |
| 8,358,897 B1* | 1/2013 | Fish et al. | ............... | 385/131 |
| 8,380,033 B1* | 2/2013 | Fang et al. | ............... | 385/131 |
| 2012/0114001 A1* | 5/2012 | Fang et al. | ............... | 372/45.01 |

* cited by examiner

*Primary Examiner* — Rhonda Peace
(74) *Attorney, Agent, or Firm* — Blakely Sokoloff Taylor & Zafman LLP

(57) ABSTRACT

"Hybrid photonic devices" describe devices wherein the optical portion—i.e., the optical mode, comprises both the silicon and III-V semiconductor regions, and thus the refractive index of the semiconductor materials and the refractive index of the bonding layer region directly effects the optical function of the device. Prior art devices utilize an optically compliant layer that is the same material as the III-V substrate; however, during the final sub-process of the bonding process, the substrates must be removed by acids. These acids can etch into the bonding layer, causing imperfections to propagate at the interface of the bonded material, adversely affecting the optical mode shape and propagation loss of the device. Embodiments of the invention utilize a semiconductor etch-selective bonding layer that is not affected by the final stages of the bonding process (e.g., substrate removal), and thus protects the bonding interface layer from being affected.

18 Claims, 5 Drawing Sheets

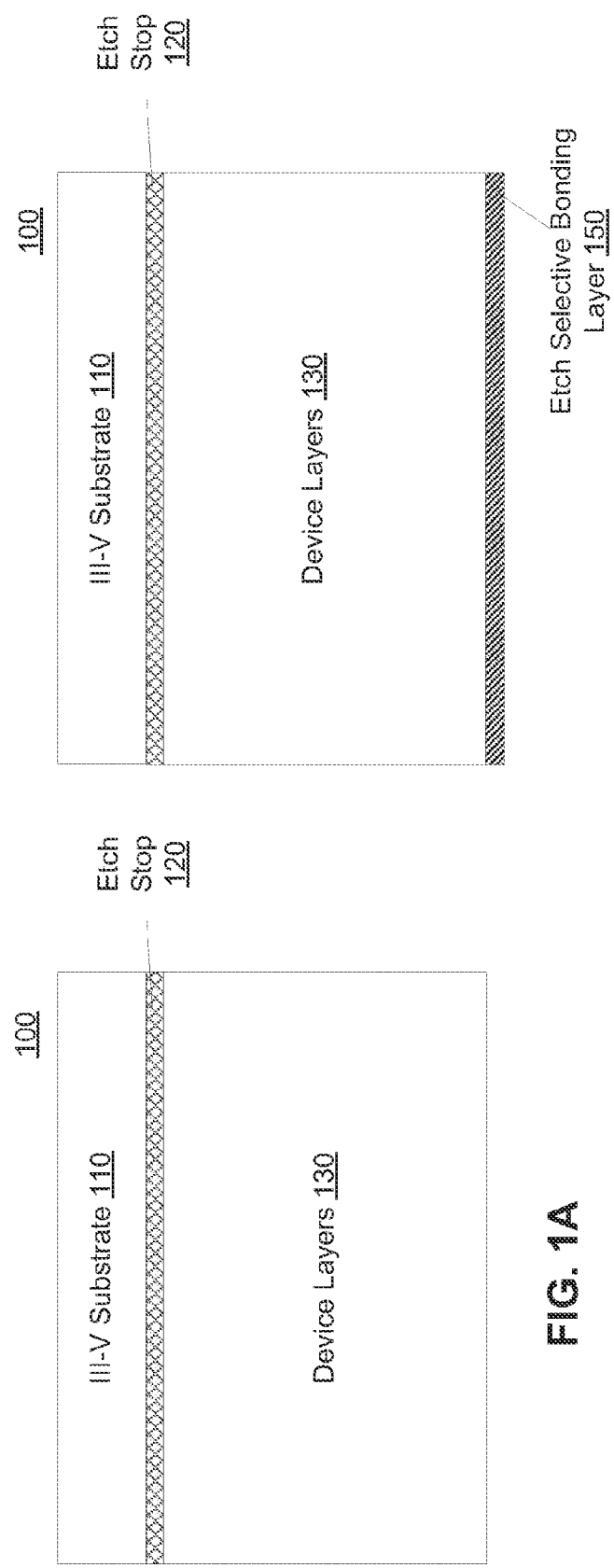

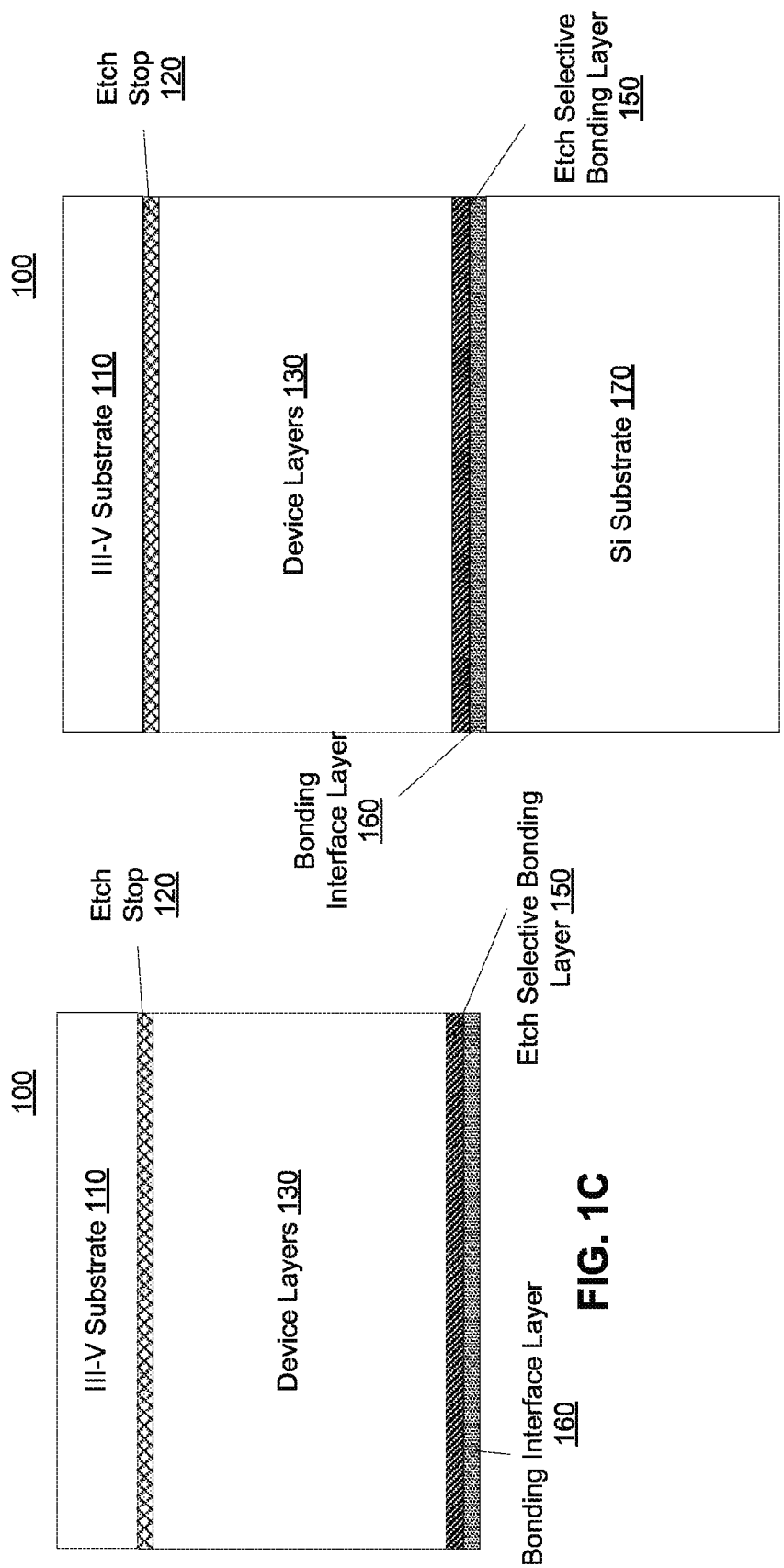

ETCH-SELECTIVE BONDING LAYER FOR HYBRID PHOTONIC DEVICES

TECHNICAL FIELD

This disclosure relates generally to photonic devices, and in particular but not exclusively, relates to bonding layers for hybrid photonic devices that comprise silicon and III-V semiconductor material.

BACKGROUND

The efficiency of an optical device (e.g., the aspects of the drive voltage or power requirement of the device) is fundamentally determined by the electro-optic materials used to construct the device. Silicon materials are more easily processed and more readily available, but are not as efficient at light emission or absorption as III-V materials. Attempts have been made to create photonic devices utilizing both materials; however, most of these attempts have been limited in that the active electro-optic components of the device are included solely in the III-V material, while silicon material is used solely for passive optical waveguiding and/or driving circuitry.

Optical devices have been formed by bonding a wafer of III-V material as an active region to silicon at a relatively low temperature. After bonding, the substrate is removed using standard photolithographic techniques on the silicon substrate. The coupling of III-V and silicon regions allows for the integration of highly efficient optical devices included in the III-V region with high speed silicon integrated circuits. Prior art methods to bond III-V and silicon regions include using spin-on glass or polymer based bonding, oxides and metals; however, these solutions are only suitable for optical devices wherein optical functionality is confined to the III-V region of the device.

For hybrid III-V/silicon optical devices wherein optical functionality occurs within both the silicon and III-V regions, prior art solutions utilize a more optically compliant layer that is the same material as the III-V substrate—e.g., an Indium Phosphide (InP) bonding layer is utilized to bond III-V regions formed on an InP substrate to silicon. These prior art bonding layers are suitable for the above described hybrid III-V/silicon optical devices, as they do not hinder the optical properties of the device at the bonded interface. However, during the final sub-process of the bonding process, the substrates must be removed by acids. These acids can etch into the bonding layer, causing imperfections to propagate at the interface of the bonded material, adversely affecting the optical mode shape and propagation loss of the hybrid optical device.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. It should be appreciated that the following figures may not be drawn to scale.

FIGS. 1A-1D illustrate diagrammatic, cross-sectional views of stages of an example embodiment process for forming bonding layers for a hybrid photonic device.

Figure 2:
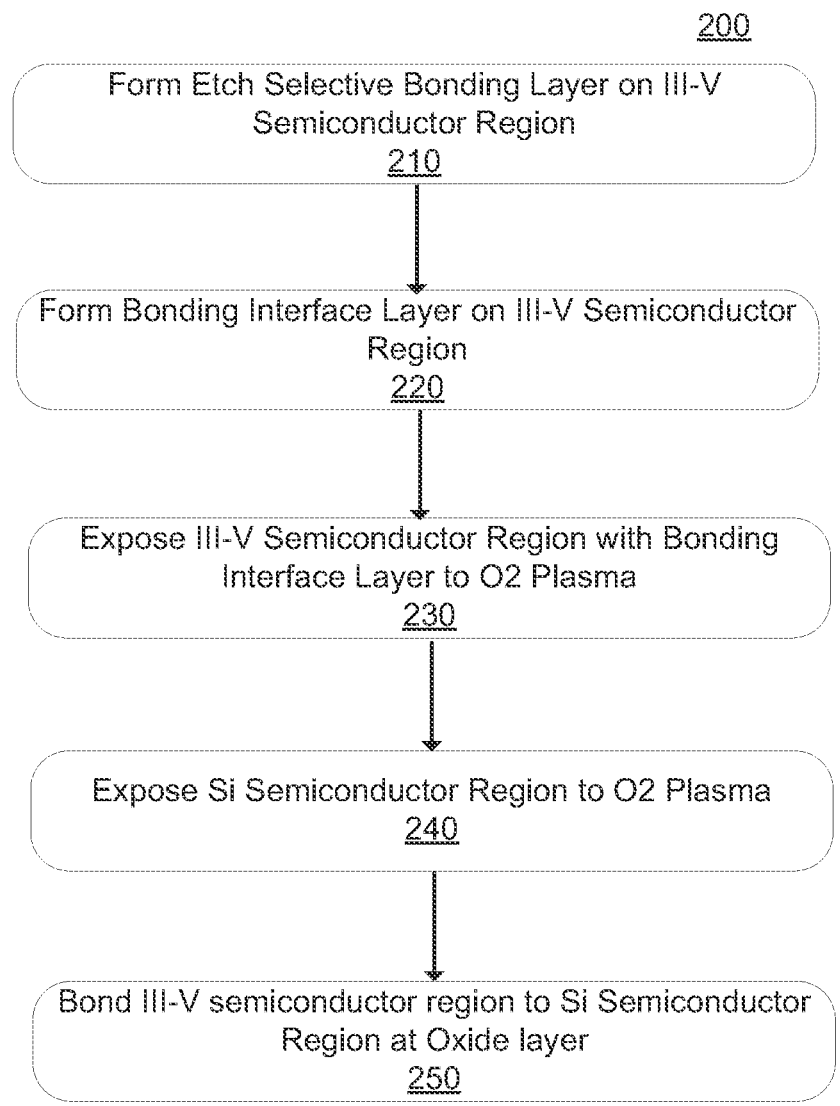
FIG. 2 is a flow diagram illustrating a process to bond a III-V semiconductor region to a silicon semiconductor region according to an embodiment of the invention.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

SPECIFICATION

Embodiments of an apparatus, system and method to bond III-V and silicon semiconductor regions are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Embodiments of the present invention relate to bonding layers for hybrid electro-optic devices that comprise a first region of silicon semiconductor material and a second region of III-V semiconductor material. Embodiments of the invention may include a first semiconductor slab (i.e. region) comprising a silicon material and a second semiconductor slab comprising a III-V material, above and partially overlapping the first semiconductor slab to create a lateral overlap region. A region of bonding layers may be formed on the second semiconductor slab to enable the bonding of the first and second semiconductor slabs at the lateral overlap region. A first etch-selective boding layer may be disposed on the second semiconductor slab to protect a bonding interface layer from a substrate removal process. An optical waveguide is formed and included in the lateral overlap region; this waveguide comprises the silicon semiconductor material, the III-V semiconductor material and the above described bonding layers. In some embodiments of the invention, the bonding interface layer comprises a material with a refractive index of at least 2.0 so as to not affect the optical mode shape or propagation loss of the hybrid electro-optical device.

III-V semiconductors have elements that are found in group III and group V of the periodic table (e.g., Indium Phosphide (InP), Indium Gallium Arsenide Phosphide (InGaAsP), Gallium Indium Arsenide Nitride (GaInAsN), Gallium Arsenide (GaAs)). The carrier dispersion effects of III-V based materials may be significantly higher than in silicon based materials for bandgaps closer to the wavelength of the light, as electron speed in III-V semiconductors is much faster than that in silicon. Thus, III-V semiconductor materials enable photonic operation with an increased efficiency at generating light from electricity and converting light back into electricity.

"Hybrid photonic devices," as referred to herein, describe devices wherein the optical portion (i.e., the optical mode) comprises both the silicon and III-V semiconductor regions and thus the refractive index of the semiconductor materials and the refractive index of the bonding layers directly affect the optical function of the device.

Bonding layers utilized in the prior art for III-V and silicon semiconductor regions include spin-on polymer or glass layers. These layers, while capable of mechanically bonding the two semiconductor regions, are made of materials that adversely affect the function of hybrid photonic devices or have a thickness that prevents optical interaction between both the silicon and III-V semiconductor regions. Prior art solutions that utilize a more optically compliant layer that include the same material as the III-V substrate do not hinder the optical properties of the device at the bonded interface; however, during the final sub-process of the bonding process, the substrates must be removed by acids. These acids can etch into the bonding layer, causing imperfections to propagate at the interface of the bonded material, adversely affecting the optical mode shape and propagation loss of the device.

Embodiments of the invention utilize a semiconductor etch-selective bonding layer that enables the bonding of III-V semiconductor region to a silicon semiconductor region of a hybrid photonic device, and is not affected by the final stages of the bonding process (e.g., substrate removal).

FIGS. 1A-1D illustrate diagrammatic, cross-sectional views of stages of an example embodiment process for forming a region of bonding layers for a hybrid photonic device. As illustrated in FIG. 1A, III-V semiconductor region 100 includes substrate layer 110, etch stop 120, and device layers 130. These layers of III-V semiconductor region 100 may be of any materials suitable for optic devices—for example, in one embodiment, substrate layer 110 comprises a semi-insulating (SI) InP substrate layer, device layer 130 comprises InP, and etch stop layer 120 comprises GaAs, Aluminum Gallium Arsenide (AlGaAs), Aluminum Arsenide (AlAs) or any functionally equivalent material that is not etched by the etchants that remove InP.

It is understood that InP, and the materials that can be epitaxially grown on it are effective III-V materials to use for photonic devices, particularly high power photonic devices, at least because of the material's thermal efficiency, high saturated electron velocity, high electron mobility, high breakdown voltage, higher gain, lower temperature sensitivity and lower optical loss and Auger recombination.

It is to be understood that III-V semiconductor region 100 is to be bonded with a corresponding silicon semiconductor region (which will also contain device layers) to form a hybrid photonic device. It is known that certain optical materials do not bond natively to silicon substrates. For example InP alone does not effectively bond directly to silicon using oxygen plasma bonding processes known in the art.

Etch-selective bonding layer 150 (as illustrated in FIG. 1B) and bonding interface layer 160 (as illustrated in FIG. 1C) may be formed to enable effective bonding of III-V semiconductor region 100 to a corresponding silicon semiconductor region. Etch-selective bonding layer 150 may comprise materials related to the III-V substrate 110 that do not etch during the substrate removal process executed during the processing of device layers 130 (e.g., a material to is not adversely affected by substrate removal acid, or whose etch rate is significantly slower than the etch rate of the material of III-V substrate 110). For example, said bonding layer may comprise transparent InP substrate alloys of InGaAsP. Other functionally equivalent materials may also be used.

Bonding interface layer 160 may comprise a high refractive index (i.e., a refractive index greater than 2.0), low modulus material that will not affect the optical mode shape or propagation loss of the resulting hybrid optical device. For the example, bonding interface layer 160 may comprise InGaP or InGaAsP. It is to be understood that bonding interface layer 160 may be relatively thin (e.g., less than 200 nm) and still be suitable for bonding purposes.

III-V semiconductor region 100, including bonding layers 150 and 160, and the silicon region on silicon substrate 170 (as illustrated in FIG. 1D) may be subjected to an oxygen plasma to grow oxide layers on each region. The regions may then be bonded at their oxide layers. In this embodiment, any process to remove substrate material from III-V semiconductor region 100 does not affect bonding interface layer 160, due to etch-selective bonding layer 150.

FIG. 2 is a flow diagram illustrating a process to bond a III-V semiconductor region to a silicon semiconductor region according to an embodiment of the invention. Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

For process 200, an etch selective bonding layer is formed on a device layer region of a III-V semiconductor region, 210. As described above, this etch selective bonding layer may comprise materials related to the III-V semiconductor region substrate that do not etch during the substrate removal process or whose etch rate is significantly slower than the etch rate of the material of III-V semiconductor region substrate.

A bonding interface layer may be formed on a III-V semiconductor region, 220. In one embodiment, the bonding interface layer is formed epitaxially—i.e., deposited and grown on the etch selective bonding layer formed on the III-V semiconductor region.

Prior to device layer processing to form the III-V portions of the resulting hybrid photonic device, the bonding interface layer is exposed to oxygen plasma, 230, to form an oxide layer on the III-V semiconductor region. This operation may comprise any oxide formation process known in the art. Because of the formation of the etch selective bonding interface layer, the bonding interface layer is not adversely affected by substrate removal sub-processes executed during the device layer processing of the III-V semiconductor region.

The silicon semiconductor region including silicon portions of the resulting hybrid photonic device is similarly exposed to oxygen plasma, 240, to form an oxide layer on the silicon semiconductor region.

The III-V and silicon semiconductor regions are thus bonded at their respective oxide layers, 250. It is to be understood that these respective oxide layers are too thin to interfere with the optical interaction between the III-V and silicon semiconductor regions.

Figure 3:
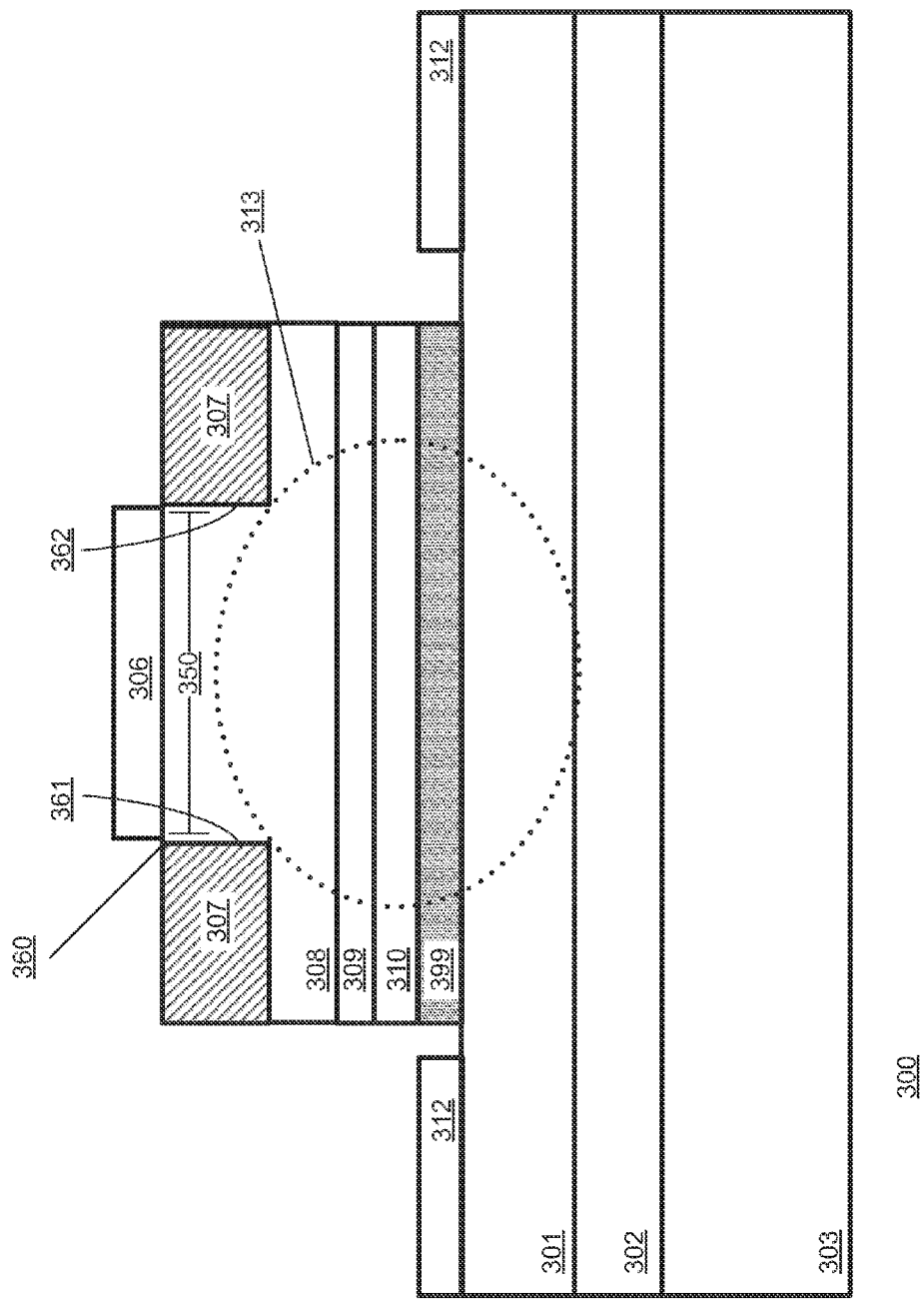
FIG. 3 is block diagram of a hybrid III-V/silicon photonic device according to an embodiment of the invention.

FIG. 3 is block diagram of a hybrid III-V/silicon photonic device according to an embodiment of the invention. In this embodiment, electro-optic device 300 includes a silicon semiconductor slab including silicon top layer 301, vertical confinement layer 302 and silicon substrate layer 303. It is to be understood that in alternative embodiments, silicon substrate layer 303 may be a diamond substrate, a glass substrate, or any functional equivalent. Device 300 further includes a III-V semiconductor slab including p-type layer 308, active layer 309 and n-type layer 310.

In an alternative embodiment, layer 308 may be an n-type layer, and layer 310 may be a p-type layer. In another alternative embodiment, layers 308 and 310 may be n-type layers, while active region 309 may include a tunnel junction to convert n-type majority carriers to p-type majority carriers.

Ridge 360 including sides 361 and 362 forms optical waveguide 350 and provides lateral confinement for optical mode 313 (vertical confinement layer 302, ridge 360 and overclad regions 307 provide vertical confinement of said optical mode). Overclad regions 307 may be formed on the device to improve mechanical stability, and may be of any material used to form vertical confinement layer 302. The ridges illustrated in this embodiment are shown to be included only in the top layers of the III-V semiconductor regions of device 300. It is to be understood that these ridges are to be viewed as examples only, and are not to limit the structure of ridges in alternative embodiments of the invention.

Device 300 further comprises bonding layer region 399, including an etch-selective bonding layer and a bonding interface layer. The bonding interface layer may comprise any bonding material as described above (i.e., having a refractive index greater than 2.0) and be formed by any process described above. Furthermore, in this embodiment bonding layer region 399 is less than 200 nm thick (FIG. 3 is not necessarily drawn to scale in order to clearly illustrate certain reference elements). Thus, the bonding layers cause no optical confinement or effect on the optical mode of the device due to the material properties and physical dimensions of the layers. Because of the formation of the etch selective bonding interface layer, the bonding interface layer is not adversely affected by substrate removal sub-processes executed during the device layer processing of the III-V semiconductor region.

In this example embodiment, electrodes 312 are coupled to silicon top layer 301 (in other embodiments for example, said electrodes may be coupled to the III-V n-type layer). Thus, it is to be understood that electrical conduction occurs through both n-type layer 310 and silicon top layer 301 when an electrical difference is applied to electrodes 306 and 312. It is to be understood the silicon top layer 301 will suffer less optical loss if it is doped for conduction and if a conductive bond is used to couple layers 301 and 310.

The electrical difference applied to electrodes 306 and 312 may be an electrical voltage or an electrical field. The photonic and electronic interaction of regions 310 and 301, which is not limited by bonding layer region 399, during application of said electrical difference will cause device 300 to amplify, modulate or detect light transmitted through optical waveguide 350 (i.e., to either forward bias (i.e., for amplification) or reverse bias (i.e., for modulation or detection) the structure). The complex refractive index (i.e., at least one of the real and the imaginary refractive index) of at least the portion of active region included in optical mode 313 changes based on an electrical difference applied to electrodes 306 and 312. These changes to the refractive index (or indexes) are proportional to the strength of the electrical difference applied to electrodes 306 and 312.

Figure 4:
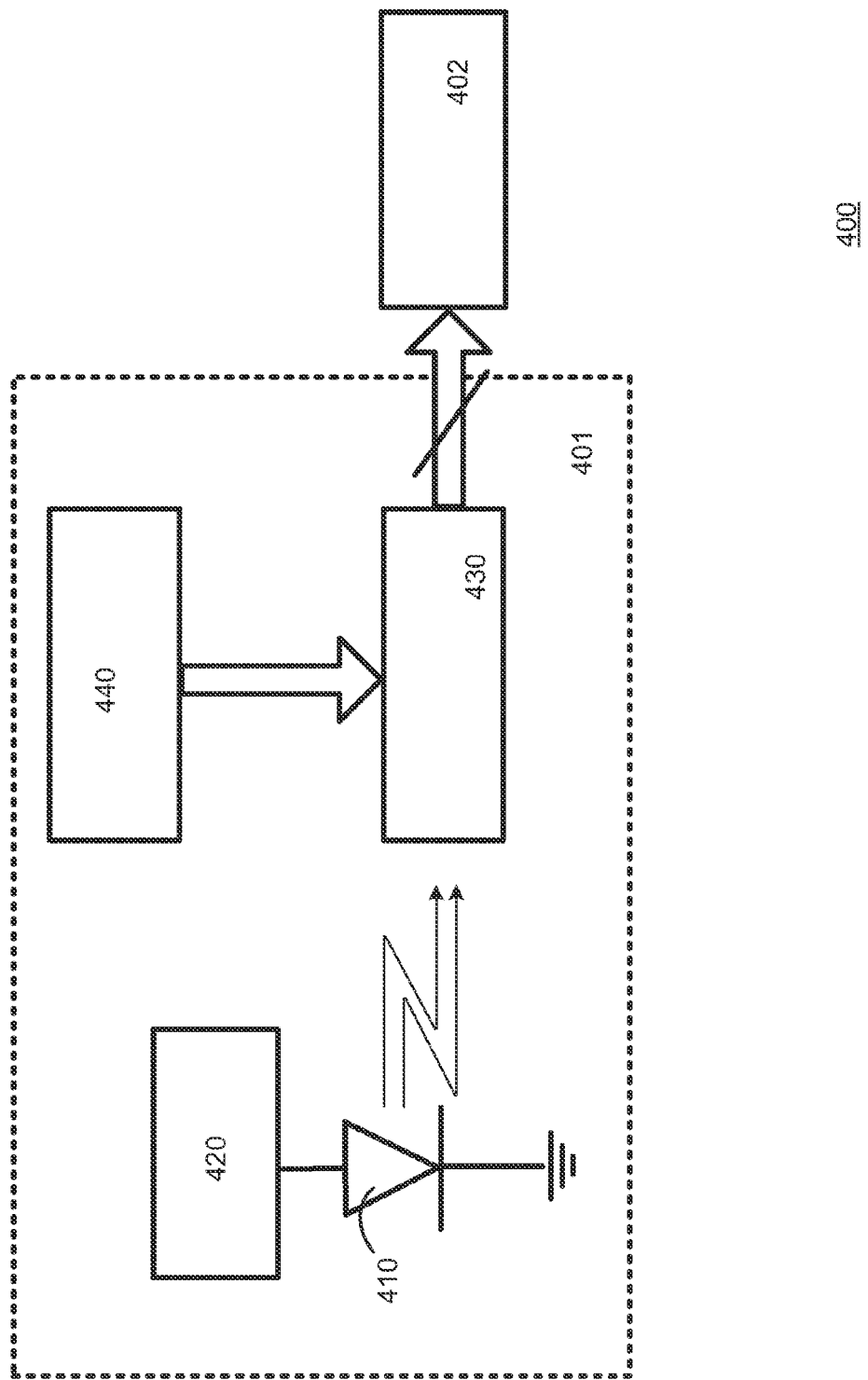
FIG. 4 is a block diagram of a simplified optical system utilizing an embodiment of the invention.

FIG. 4 is a block diagram of a simplified optical system utilizing an embodiment of the invention. System 400 includes transmitter 401 and receiver 402. Transmitter 401 includes light source 410 and light source controller 420. In the illustrated embodiment, light source 420 is a laser utilizing a hybrid active gain structure, wherein the structure comprises any embodiment of the invention described above.

Light source controller 420 may control the hybrid active gain structure of light source 410 (i.e., light source controller 420 may create an electrical difference at electrical contacts of light source 410). In one embodiment, light source controller 420 comprises silicon circuitry while light source 410 comprises III-V and silicon semiconductor material. Light source 410 may transmit optical signals to modulator 430 via any transmission medium known in the art.

The structure of modulator 430 may comprise any embodiment of the invention described above, or any functional equivalent. Modulator 430 may perform either amplitude or phase modulation of the light received from light source 410. In one embodiment, optical waveguides of modulator 430 are controlled by modulator controller 440 (i.e., modulator controller 440 may create an electrical difference at electrical contacts of modulator 430). The modulated output of modulator 630 may be transmitted to receiver 402 via any transmission medium known in the art. Receiver 602 may include an optical device wherein the structure of said device comprises any embodiment of the invention described above, or any functional equivalent.

In one embodiment, system 400 is included in a single device or chip, wherein silicon components of system 400 are included on a silicon portion of the chip, and III-V semiconductor components of system 400 are included on a III-V portion of the chip. These portions may be fabricated independently and subsequently bonded via any bonding process described above using any of the etch-selective bonding layers and the bonding interface layers described above, or any functional equivalent.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

The invention claimed is:

1. An apparatus comprising:
   a first semiconductor slab comprising a silicon material;
   a second semiconductor slab comprising a III-V material, above and partially overlapping the first semiconductor slab to create a lateral overlap region;
   an etch-selective bonding layer formed on the second semiconductor slab and formed from a material related to the III-V material of the second semiconductor slab;
   a bonding interface layer formed on the etch-selective bonding layer to enable the second semiconductor slab to be bonded to the first semiconductor slab at the lateral overlap region, the bonding interface layer comprising a material with a refractive index of at least 2.0; and
   an optical waveguide included in the lateral overlap region and comprising the silicon semiconductor material, the III-V semiconductor material, the etch-selective bonding layer and the bonding interface layer.

2. The apparatus of claim 1, wherein the bonding interface layer further comprises a material epitaxially deposited on the etch-selective bonding layer.

3. The apparatus of claim 1, wherein the III-V material comprises Indium Phosphide (InP).

4. The apparatus of claim 3, wherein the etch-selective bonding layer comprises a material including InP.

5. The apparatus of claim 4, wherein the bonding interface layer comprises Indium Gallium Phosphide (InGaP).

6. The apparatus of claim 1, the first semiconductor slab to include a first oxide layer, the second semiconductor slab to include a second oxide layer formed over the bonding interface layer, wherein the first and second semiconductor slabs are bonded at their oxide layers.

7. A method comprising:
  forming an etch-selective bonding layer on a III-V semiconductor region, the bonding layer comprising a material related to the material of the III-V semiconductor region;
  forming a bonding interface layer on the III-V semiconductor region, the bonding interface layer comprising a material with a refractive index of at least 2.0;
  bonding a silicon semiconductor region to the III-V semiconductor region at the bonding interface layer, the III-V semiconductor region above and partially overlapping the silicon semiconductor region to create a lateral overlap region, wherein an optical waveguide is included in the lateral overlap region and comprises the silicon semiconductor material, the III-V semiconductor material, the etch-selective bonding layer and the bonding interface layer.

8. The method of claim 7, wherein forming the bonding interface layer comprises epitaxially depositing the material of the etch-selective bonding layer on the III-V semiconductor region.

9. The method of claim 7, wherein the III-V material comprises Indium Phosphide (InP).

10. The method of claim 9, wherein the etch-selective bonding layer comprises a material including InP.

11. The method of claim 10, wherein the bonding interface layer comprises Indium Gallium Phosphide (InGaP).

12. The method of claim 7, wherein bonding the silicon semiconductor region to the III-V semiconductor region at the bonding interface layer comprises:
  subjecting the III-V semiconductor region and the bonding interface layer to an oxygen plasma to form a first oxide layer; and
  subjecting the silicon semiconductor region to the oxygen plasma to form a second oxide layer;
  wherein bonding the silicon semiconductor region to the III-V semiconductor region at the bonding interface layer includes bonding the first and second oxide layers.

13. A system comprising:
  a light source;
  a modulator to receive light from the light source; and
  a transmission medium to operatively couple the light source and the modulator; wherein at least one of the light source and the modulator includes an optical device comprising:
    a first semiconductor slab comprising a silicon material;
    a second semiconductor slab, comprising a III-V material, above and partially overlapping the first semiconductor slab to create a lateral overlap region;
    an etch-selective bonding layer formed on the second semiconductor slab and formed from a material related to the III-V material of the second semiconductor slab;
    a bonding interface layer formed on the etch-selective bonding layer to enable the second semiconductor slab to be bonded to the first semiconductor slab at the lateral overlap region, the bonding interface layer comprising a material with a refractive index of at least 2.0; and
    an optical waveguide included in the lateral overlap region and comprising the silicon semiconductor material, the III-V semiconductor material, the etch-selective bonding layer and the bonding interface layer.

14. The system of claim 13, wherein the bonding interface layer is further comprises a material epitaxially deposited on the etch-selective bonding layer.

15. The system of claim 13, wherein the III-V material comprises Indium Phosphide (InP).

16. The system of claim 15, wherein the etch-selective bonding layer comprises a material including InP.

17. The system of claim 16, wherein the bonding interface layer comprises Indium Gallium Phosphide (InGaP).

18. The system of claim 13, the first semiconductor slab to include a first oxide layer, the second semiconductor slab to include a second oxide layer formed over the bonding interface layer, wherein the first and second semiconductor slabs are bonded at their oxide layers.

* * * * *